(12) United States Patent
Cheng et al.

(10) Patent No.: US 7,696,038 B1
(45) Date of Patent: Apr. 13, 2010

(54) METHODS FOR FABRICATING FLASH MEMORY DEVICES

(75) Inventors: Ning Cheng, San Jose, CA (US); Kuo-Tung Chang, Saratoga, CA (US); Hiroyuki Kinoshita, San Jose, CA (US); Timothy Thurgate, Sunnyvale, CA (US); Wei Zheng, Santa Clara, CA (US); Ashot Melik-Martirosian, Sunnyvale, CA (US); Angela Hui, Fremont, CA (US); Chih-Yuh Yang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 496 days.

(21) Appl. No.: 11/412,365

(22) Filed: Apr. 26, 2006

(51) Int. Cl.
*H01L 21/8238* (2006.01)

(52) U.S. Cl. ............... 438/231; 257/686; 257/E21.209; 257/E29.126; 257/E29.137

(58) Field of Classification Search ................ 257/350, 257/686, E21.209, E29.126, E29.137; 438/526, 438/261, 248, 142, 151, 231
See application file for complete search history.

(56) References Cited

U.S. PATENT DOCUMENTS

| | | | | |
|---|---|---|---|---|
| 5,891,771 A | * | 4/1999 | Wu et al. | 438/248 |
| 6,146,981 A | * | 11/2000 | Chen | 438/526 |
| 6,639,271 B1 | | 10/2003 | Zheng et al. | |
| 6,667,212 B1 | * | 12/2003 | Shiraiwa et al. | 438/261 |
| 6,861,307 B2 | | 3/2005 | Zheng et al. | |
| 6,917,068 B1 | | 7/2005 | Krivokapic | |
| 7,115,949 B2 | * | 10/2006 | Hoefler et al. | 257/350 |
| 2004/0021172 A1 | | 2/2004 | Zheng et al. | |

* cited by examiner

*Primary Examiner*—Leonardo Andújar
*Assistant Examiner*—Monica D Harrison

(57) ABSTRACT

Methods for fabricating flash memory devices are provided. In accordance with an exemplary embodiment of the invention, a method for fabricating a memory device comprises forming a first gate stack and a second gate stack overlying a substrate. A trench is etched into the substrate between the first gate stack and the second gate stack. A first impurity doped region is formed within the substrate underlying the trench.

22 Claims, 6 Drawing Sheets

US 7,696,038 B1

METHODS FOR FABRICATING FLASH MEMORY DEVICES

FIELD OF THE INVENTION

The present invention generally relates to flash memory devices, and more particularly relates to methods for fabricating memory devices with reduced transient program disturb.

BACKGROUND OF THE INVENTION

A type of commercially available flash memory product is a MirrorBit® memory device available from Spansion, LLC, located in Sunnyvale, Calif. A MirrorBit cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

An exemplary MirrorBit® memory device 10, illustrated in FIG. 1, includes a P-type semiconductor substrate 12 within which are formed spaced-apart source/drain regions 14, 16 respectively (both typically having N-type conductivity), otherwise known as bitlines. A charge trapping layer or stack 18 is disposed on the top surface of the substrate between the bitlines. The charge trapping stack 18 typically comprises, for example, a charge trapping layer, often a silicon nitride layer 20, disposed between a first or bottom silicon dioxide layer (commonly referred to as a tunnel oxide layer) 22 and a second or top silicon dioxide layer 24. A gate electrode 26, which typically comprises an N or N+ polysilicon layer, is formed over the charge trapping stack to form a first storage element or bit 28 and a second storage element or bit 30 of memory cells 32 and 34.

A dual bit memory cell 34 is programmed utilizing a hot electron injection technique. More specifically, programming of the first bit 28 of memory cell 32 comprises injecting electrons into the charge trapping layer 20 and applying a bias between bitlines 14 and 16 while applying a high voltage to the control gate 26. In an exemplary embodiment, this may be accomplished by grounding bitline 16 and applying approximately 5 V to bitline 14 and approximately 10 V to the control gate 26. The voltage on the control gate 26 inverts a channel region 36 while the bias accelerates electrons from bitline 14 into the channel region 36 towards bitline 16. The 4.5 eV to 5 eV kinetic energy gain of the electrons is more than sufficient to surmount the 3.1 eV to 3.5 eV energy barrier at channel region 36/tunnel oxide layer 22 interface and, while the electrons are accelerated towards source/drain region 16, the field caused by the high voltage on control gate 26 redirects the electrons towards the charge trapping layer of first bit 28. Those electrons that cross the interface into the charge trapping layer remain trapped for later reading.

Similarly, programming the second bit 30 by hot electron injection into the charge trapping layer 20 comprises applying a bias between bitlines 16 and 14 while applying a high voltage to the control gate 26. This may be accomplished by grounding bitline 14 and applying approximately 5V to bitline 16 and approximately 10 V to the control gate 26. The voltage on the control gate 26 inverts the channel region 36 while the bias accelerates electrons from bitline 16 into the channel region 36 towards bitline 14. The field caused by the high voltage on control gate 26 redirects the electrons towards the charge trapping layer of second bit 30. Those electrons that cross the interface into charge trapping layer 20 of second bit 30 remain trapped for later reading.

With advances in semiconductor process technology, the trend is toward smaller and smaller semiconductor devices, including memory devices. However, as the-above described MirrorBit® is scaled smaller in size, transient program disturb (TPD) becomes a bigger challenge. TPD results during programming of the dual bit devices. For example, hot holes generated during programming of first bit 28 of memory cell 32 have a secondary impact ionization below bitline 16. Secondary electrons resulting from the secondary impact ionization diffuse to the disturbed cell 34 below gate 26 where they are accelerated by the drain depletion region and injected into the charge trapping stack 18 of second bit 30. This injection of secondary electrons into second bit 30 of cell 34 can adversely affect the memory window of bit 30.

Accordingly, it is desirable to provide a flash memory device that reduces transient program disturb. In addition, it is desirable to provide a dual bit memory device with dual bit memory cells that can be reliably programmed. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for fabricating a memory device comprises forming a first gate stack and a second gate stack overlying a substrate. A trench is etched into the substrate between the first gate stack and the second gate stack. A first impurity doped region is formed within the substrate underlying the trench.

In accordance with another exemplary embodiment of the present invention, a method for fabricating a dual bit memory device comprises fabricating a charge trapping stack overlying a substrate and forming a control gate material overlying the charge trapping stack. The control gate material and the charge trapping stack are etched to the substrate and the substrate is etched to form a trench. A first impurity dopant is implanted within the substrate underlying the trench to form a first bitline region.

In accordance with a further exemplary embodiment of the present invention, a method for fabricating a memory device comprises fabricating a first gate stack and a second gate stack overlying a substrate. A first impurity doped region is formed in the substrate between the first gate stack and the second gate stack. Gate spacers are fabricated about sidewalls of the first gate stack and the second gate stack and a second impurity doped region is formed in the substrate between the first gate stack and the second gate stack. The second impurity doped region is deeper than the first impurity doped region.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
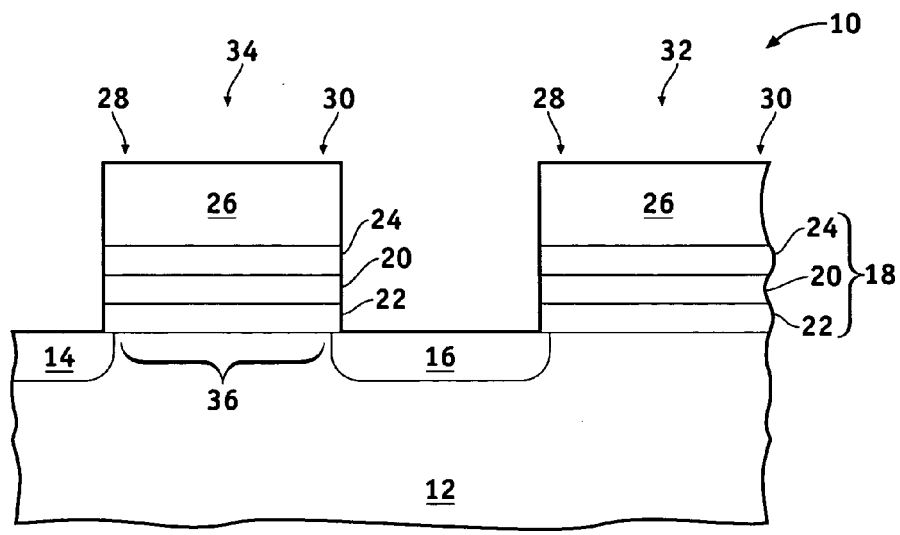
FIG. 1 is a cross-sectional view of a portion of a dual bit memory device available in the prior art.
Figure 2:
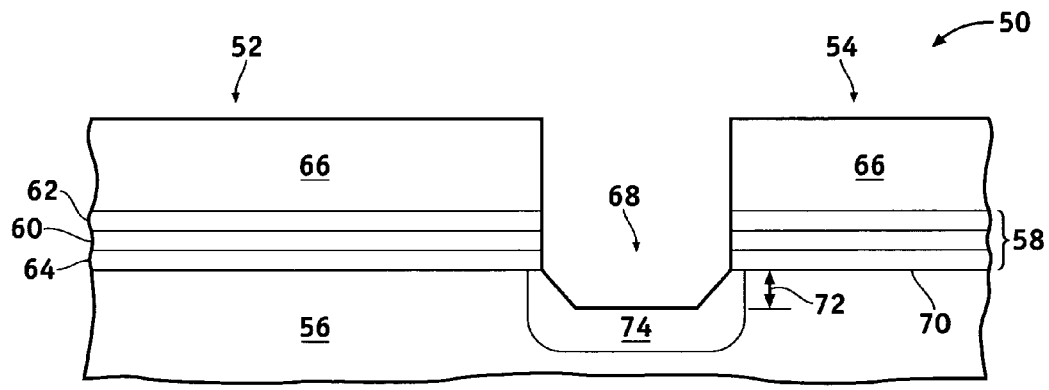
FIG. 2 is a cross-sectional view of a portion of a dual bit memory device in accordance with an exemplary embodiment of the present invention.

Referring to FIG. 2, in accordance with an exemplary embodiment of the present invention, a portion of a dual bit flash memory device 50 that may be programmed with reduced transient program disturb challenges is illustrated. Memory device 50 has a first gate stack 52 and a second gate stack 54 disposed on a P-type silicon substrate 56. Each gate stack 52 and 54 comprises a multi-layer dielectric-charge trapping-dielectric stack 58. Charge trapping stack 58 may comprise a conventional oxide-nitride-oxide (ONO) layer or stack having, for example, a silicon nitride layer 60 disposed between upper and lower silicon dioxide layers 62 and 64, respectively. A control gate 66 overlies the upper oxide layer 62 of the charge tapping stack 58 of each gate stack 52, 54. The control gate may be formed of polysilicon and may be doped with an N-type impurity.

As illustrated in FIG. 2, the first and second gate stacks 52, 54 are separated by a trench 68 that has been formed in substrate 56 using gate stacks 52, 54 as etch masks. The trench 68 has a depth, indicated by double-headed arrow 72, in the range of about 100 to about 800 angstroms as measured from a surface 70 of substrate 56. An impurity doped region 74, otherwise known as a bitline region, is disposed underlying trench 68. In this regard, during programming of cell 52, secondary electrons resulting from secondary impact ionization are blocked by trench 68 and impurity doped region 74 and are not able to diffuse to cell 54. Similarly, during programming of cell 54, secondary electrons resulting from secondary impact ionization are blocked by trench 68 and impurity doped region 74 and are not able to diffuse to cell 52.

Figure 3:
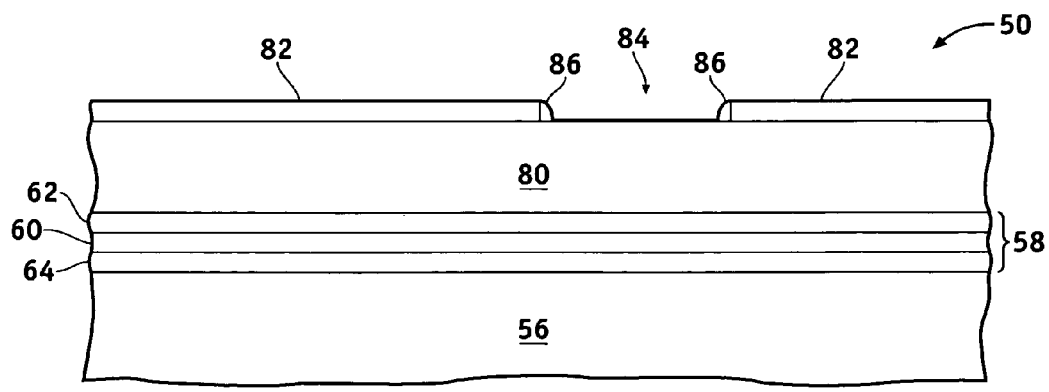
FIGS. 3-5 illustrate, in accordance with an exemplary embodiment of the present invention, a method for fabricating a portion of the dual bit memory device of FIG. 2.
Figure 4:
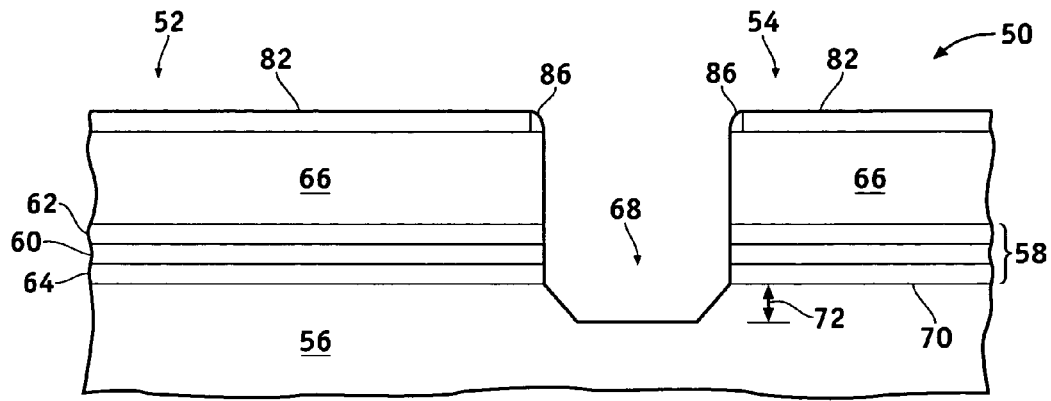
Figure 5:
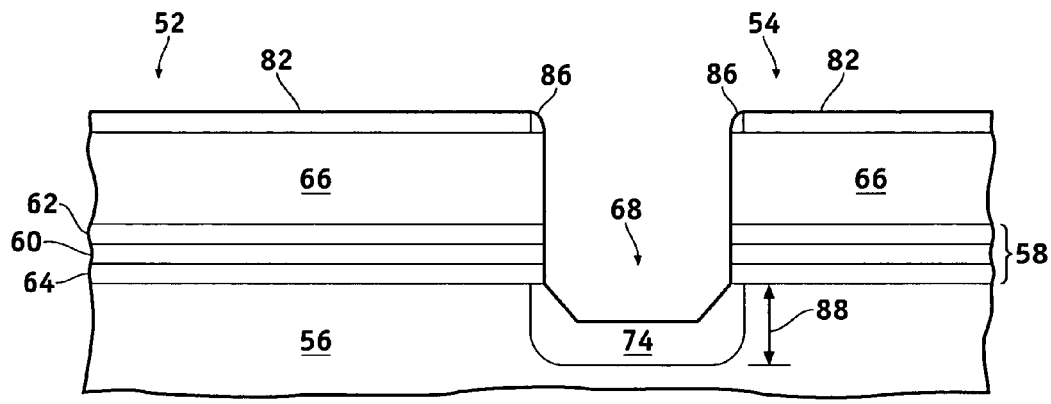

In accordance with an exemplary embodiment of the present invention, FIGS. 3-5 illustrate a method for fabricating a memory device, such as the flash memory device 50 of FIG. 2, that can be scaled with decreased device dimensions while overcoming challenges of transient program disturb. FIGS. 3-5 illustrate various cross-sectional views of flash memory device 50. Various steps in the manufacture of flash memory device 50 are well known and so, in the interest of brevity, many conventional steps will only be mentioned briefly herein or will be omitted entirely without providing well known process details.

As illustrated in FIG. 3, the manufacture of flash memory device 50 begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 56 may be a bulk silicon wafer or a thin layer of silicon on an insulating layer (commonly known as a silicon-on-insulator wafer or SOI wafer) that, in turn, is supported by a silicon carrier wafer.

A first silicon oxide layer 64 and a silicon nitride layer 60 of a multi-layer dielectric-charge trapping-dielectric stack 58, such as for example a multilayer ONO stack, are formed overlying substrate 56. The two layers may be formed using any appropriate process steps and materials, including oxidation and/or deposition techniques as are known, such as thermal deposition, chemical vapor deposition (CVD), low pressure chemical vapor deposition (LPCVD), plasma enhanced chemical vapor deposition (PECVD), or atomic layer deposition (ALD). In the case of oxide dielectrics, any of the oxide layers can include nitrogen or other dopants for optimal device and reliability performance. In addition, the nitride layer can be rich in Si, N, and/or dopants such as oxygen to facilitate enhanced device performance and reliability performance. The layers comprising stack 58 can be any suitable multi-layer dielectric-charge trapping-dielectric stack, including, but not limited to, the ONO stack illustrated in FIG. 2 comprising first silicon oxide layer 64, silicon nitride layer 60 overlying first silicon oxide layer 64, and a second silicon oxide layer 62 overlying silicon nitride layer 60. Alternatively (although not illustrated), the layers of the completed multi-layer stack 58 overlying substrate 56 may comprise, for example, a first oxide layer overlying substrate 56, a nitride layer overlying the first oxide layer, and a high-dielectric constant charge blocking layer. In a preferred embodiment of the present invention, multi-layer stack 58 has a total thickness that is no greater than about 10 nm.

A control gate material layer 80, preferably of polycrystalline silicon or, in the alternative, metal or other conductive material, is deposited overlying the multi-layer stack 58. The layer of polycrystalline silicon can be deposited as an impurity doped layer, but is preferably deposited as undoped polycrystalline silicon and is subsequently impurity doped by ion implantation. A layer 82 of antireflective coating material (ARC) such as silicon oxide, silicon nitride, or silicon oxynitride can be deposited onto the surface of the polycrystalline silicon layer 80 to aid in subsequently patterning the polycrystalline silicon. The polycrystalline material can be deposited to a thickness of about 300 angstroms to about 1200 angstroms by LPCVD by the hydrogen reduction of silane ($SiH_4$). ARC layer 82 can be deposited to a thickness of about 50 nm, also by LPCVD.

In one embodiment of the invention, the ARC layer 82 can be patterned using conventional photolithography techniques to form an opening 84. A silicon oxide layer (not shown) can be deposited within opening 84 and overlying ARC layer 82 and then anisotropically etched, such as by reactive ion etching (RIE) using $CHF_3$, $CF_4$, or $SF_6$ chemistry or any other suitable method, to form oxide spacers 86 about the sidewalls of ARC layer 82.

Referring to FIG. 4, the polycrystalline silicon layer 80 and the multi-layer stack 58 are etched by, for example, plasma etching in a Cl or $HBr/O_2$ chemistry, to form control gates 66 of a first gate stack 52 and a second gate stack 54. Silicon substrate 56 is etched by, for example, the same chemistry, to form a trench 68 within silicon substrate 56. As described above, trench 68 has a depth, illustrated by double-headed arrow 72, in the range of about 100 to about 800 angstroms as measured from a surface 70 of substrate 56.

Referring to FIG. 5, after formation of trench 68, gate stacks 52 and 54 are used as an ion implantation mask to form an impurity doped region or bitline region 74 in silicon substrate 56 below trench 68. The bitline region 74 preferably is formed by implanting an N-type impurity dopant, preferably arsenic ions or phosphorous ions, using an ion implant energy in the range of about 2 keV to about 30 keV. Preferably, the ion implant energy is in the range of about 3 keV to about 20 keV. The bitline region 74 and the trench 68 have a combined depth, illustrated by double-headed arrow 88, of about 400 to about 1200 angstroms. Following the formation of bitline region 74, the ARC layer 82 and oxide spacers 86 can be removed using conventional methods.

Figure 6:
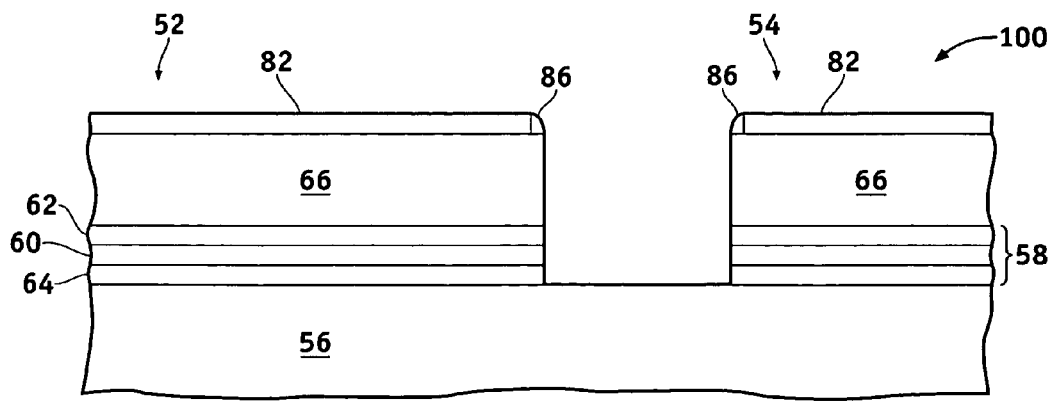
FIGS. 6-8 illustrate a method for fabricating a portion of dual bit memory device in accordance with another exemplary embodiment of the present invention.
Figure 7:
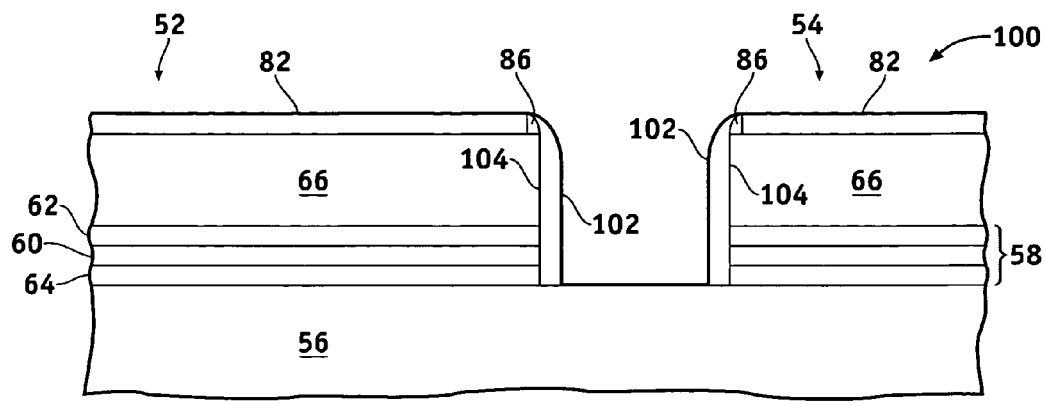
Figure 8:
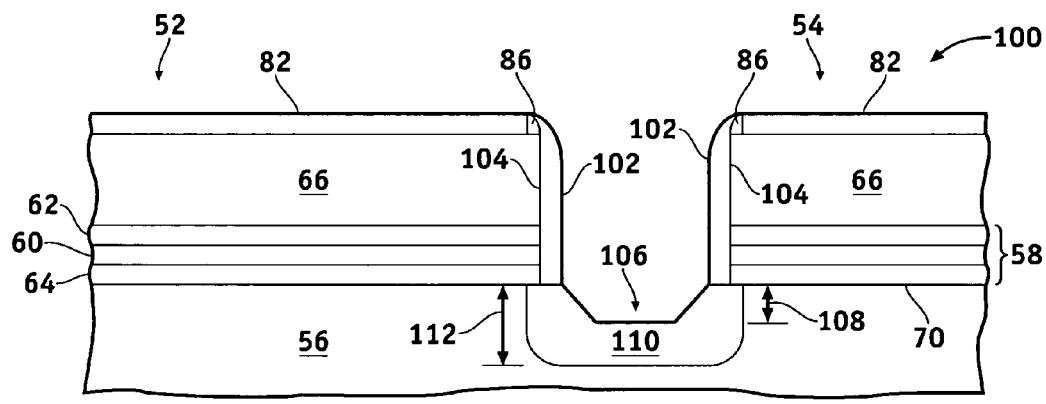

FIGS. 6-8 illustrate a method for fabricating a memory device 100 in accordance with another exemplary embodiment of the present invention. Flash memory device 100 is similar to flash memory device 50 of FIGS. 3-5 and, accordingly, elements of FIGS. 6-8 that have the same reference numbers as elements of FIGS. 3-5 are the same elements of FIGS. 3-5 and may be formed of any of the same materials and by any of the same methods as described above with reference to FIGS. 3-5. The method described with reference to FIGS. 6-8 begins by utilizing the steps described above with reference to FIG. 3, which, for brevity, will not be described again. Accordingly, after performing the steps illustrated in FIG. 3, the polycrystalline silicon layer 80 and the multi-layer stack 58 are etched to form control gates 66 of first gate stack 52 and second gate stack 54 and to expose silicon substrate 56.

After formation of gate stacks 52 and 54, a gate spacer material layer (not shown) is deposited conformally overlying gate stacks 52 and 54 and substrate 56. The gate spacer material layer may be formed of any suitable insulating material, such as silicon oxide, silicon nitride, or a suitable polymer. The gate spacer material then is anisotropically etched by, for example, RIE using a $CHF_3$, $CF_4$, or $SF_6$ chemistry, to form gate spacers 102 about the sidewalls 104 of gate stacks 52 and 54, as illustrated in FIG. 7.

Referring to FIG. 8, using the gate spacers 102 and gate stacks 52 and 54 as a etch mask, the silicon substrate 56 is etched to form a trench 106 in the silicon substrate. Silicon substrate 56 may be etched by, for example, plasma etching in a $C_4H_8$ and $O_2$ chemistry. Trench 106 has a depth, illustrated by a double-headed arrow 108, in the range of about 100 to about 800 angstroms as measured from surface 70 of substrate 56. After formation of trench 106, gate stacks 52 and 54 and gate spacers 102 are used as an ion implantation mask to form an impurity doped region or bitline region 110 in silicon substrate 56 below trench 106. The bitline region 110 preferably is formed by implanting an N-type impurity dopant, preferably arsenic ions or phosphorous ions, using an ion plasma energy in the range of about 2 keV to about 30 keV. Preferably, the ion implant energy is in the range of about 3 keV to about 20 keV. The bitline region 74 and the trench 106 have a combined depth, illustrated by double-headed arrow 112, of about 400 to 1200 angstroms. By using gate spacers 102, the width of the space between memory cells 52 and 54 can be made smaller. Accordingly, the depth 112 of trench 106 and bitline region 110 can be larger than the depth 88 of trench 69 and bitline region 74 of FIG. 5 while being fabricated using the same ion implant energy. Following the formation of bitline region 110, the ARC layer 82, oxide spacers 86, and the gate spacers 102 can be removed using conventional methods.

Figure 9:
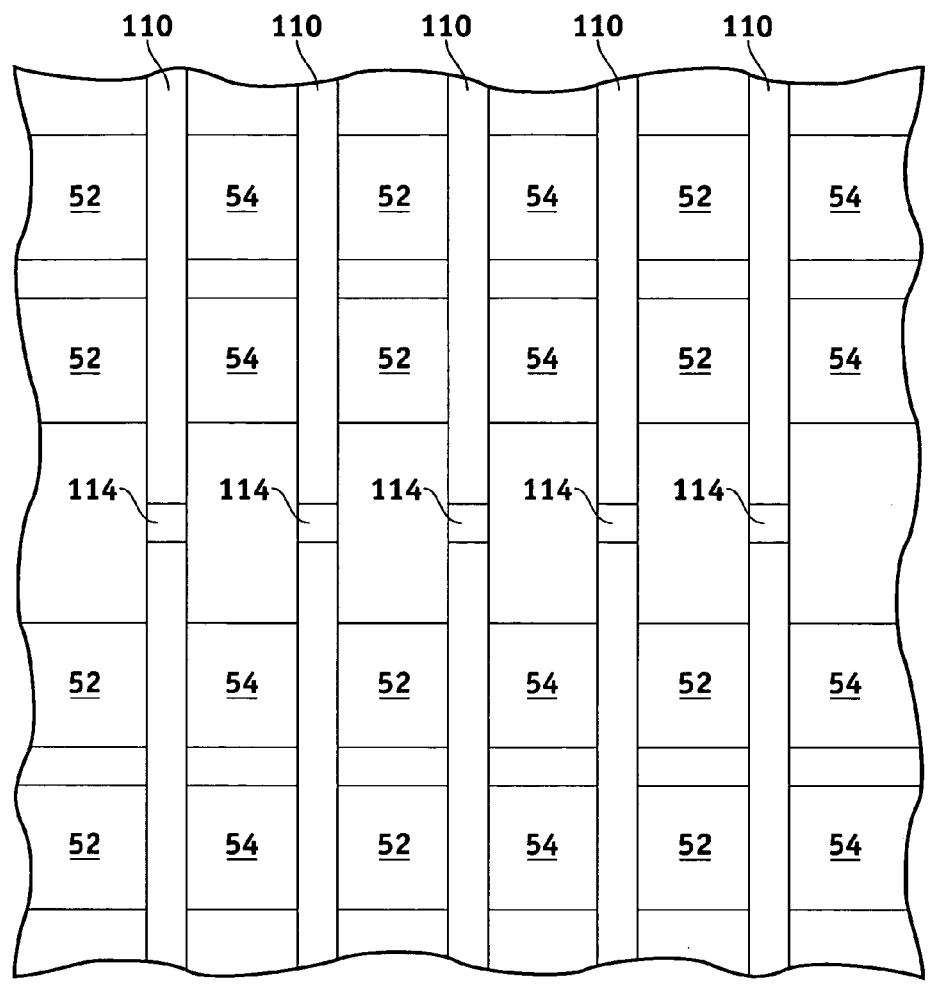
FIG. 9 is a top view of a memory device array fabricated in accordance with the method illustrated in FIGS. 6-8.
Figure 10:
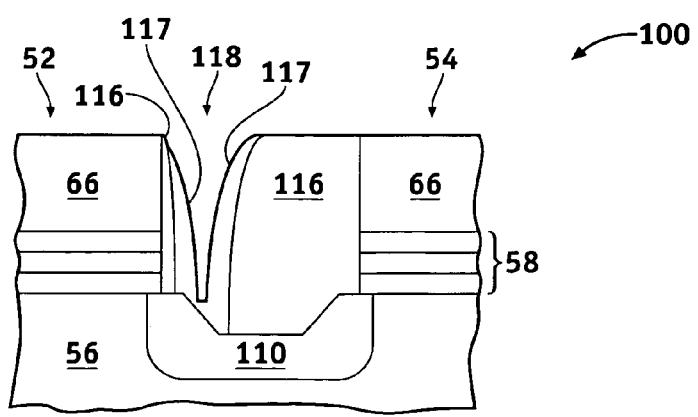
FIG. 10 is a cross-sectional view of a portion of the memory device of FIGS. 6-8 with a via formed therein.
Figure 11:
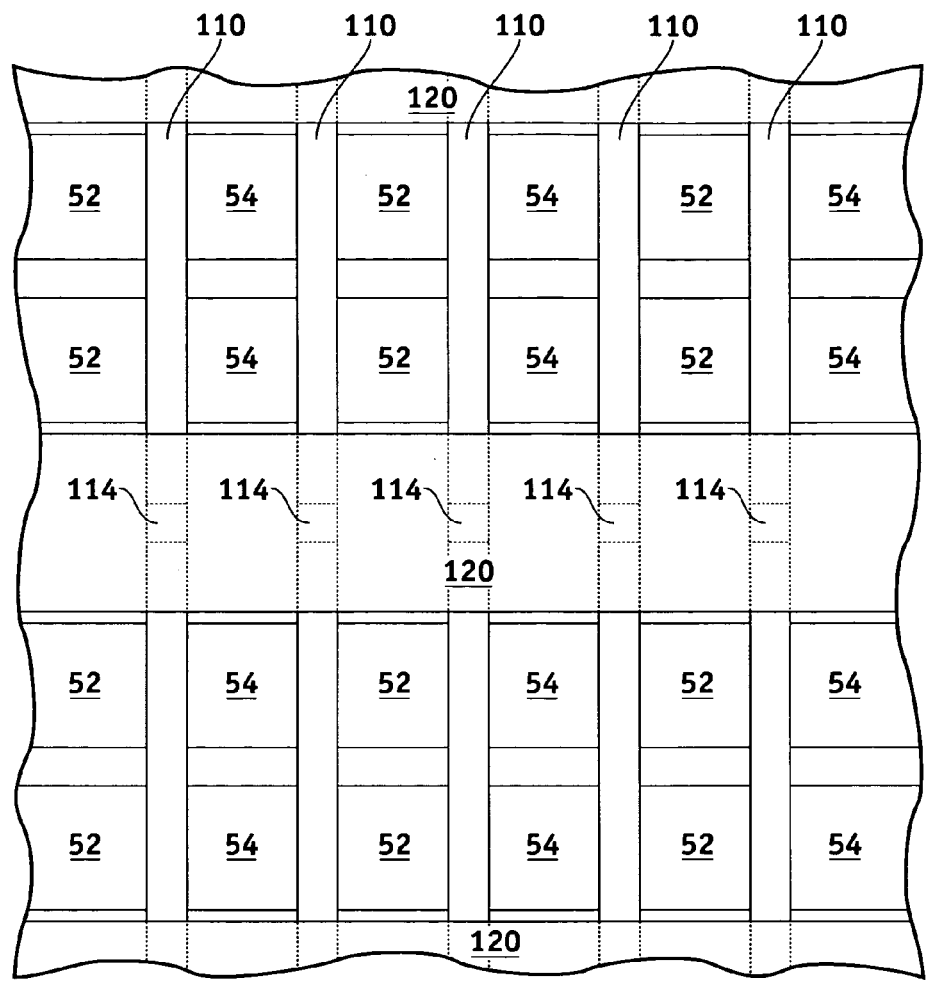
FIG. 11 illustrates a method for fabricating a dual bit memory device array in accordance with another exemplary embodiment of the present invention.

After formation of bitline region 110 and removal of gate spacers 102, a contact to bitline region 110 may be made, typically at a location 114 illustrated in FIG. 9. Referring to FIG. 10, to form a contact to bitline region 110 at location 114, an insulating material 116, such as a silicon oxide, may be deposited between gate stacks 52 and 54 and within trench 106 and a via 118 is etched therethrough to substrate 56. To decrease the width of via 118, a second insulating material 117, such as a silicon nitride, then is conformally deposited over insulting material 116. However, insulating material 117 may "pinch off" within via 118, thus preventing a subsequently deposited conductive material from contacting bitline region 110. Accordingly, in an exemplary embodiment of the invention, after etching of control gate material 66 and charge trapping stack 58, as illustrated in FIG. 6, and after formation of gate spacer 102 illustrated in FIG. 7, a mask 120 may be selectively deposited orthogonally to the direction that the bitline regions 110 to prevent formation of trenches 106 at those locations 114 where a contact is to be made, as illustrated in FIG. 11.

Figure 12:
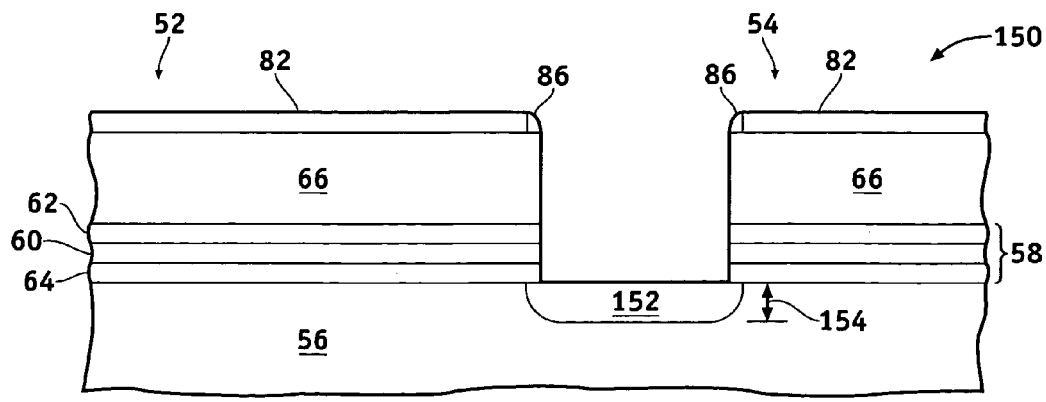
FIGS. 12-14 illustrate a method for fabricating a portion of dual bit memory device in accordance with a further exemplary embodiment of the present invention.
Figure 13:
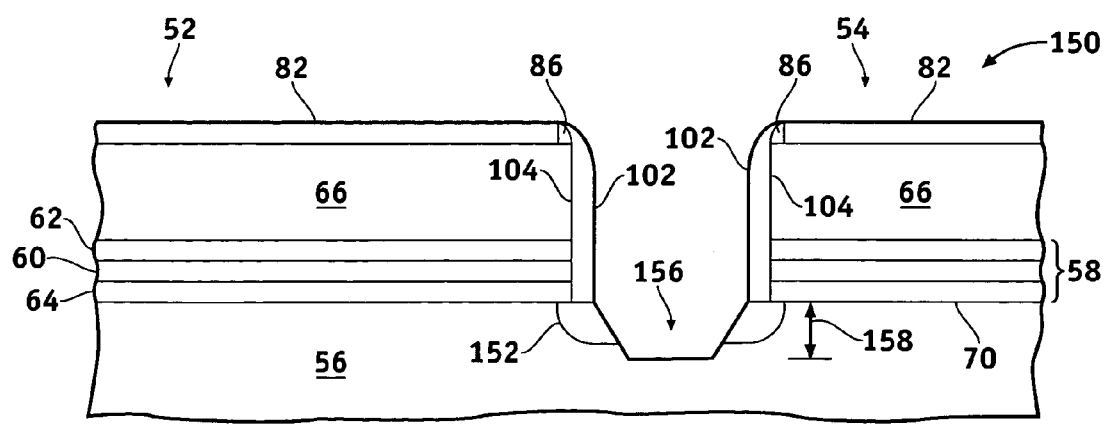
Figure 14:
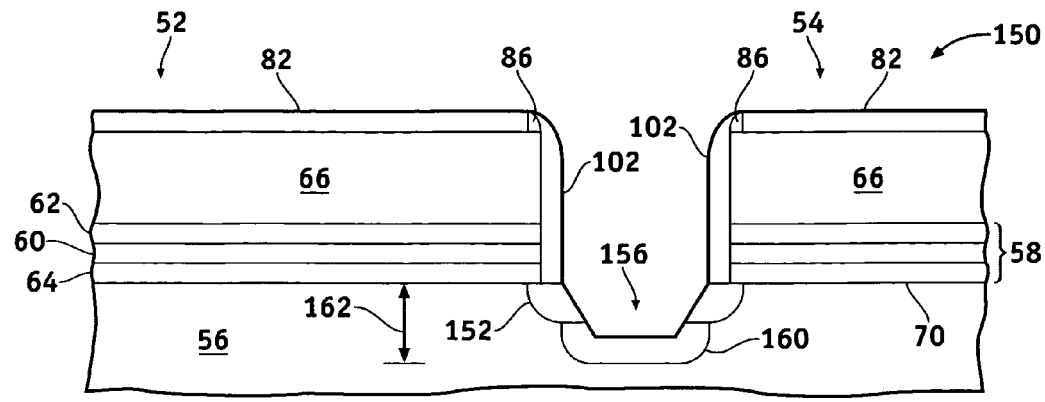

FIGS. 12-14 illustrate a method for fabricating a memory device 150 in accordance with another exemplary embodiment of the present invention. Flash memory device 150 is similar to flash memory device 50 of FIGS. 3-5 and, accordingly, elements of FIGS. 12-14 that have the same reference numbers as elements of FIGS. 3-5 are the same elements of FIGS. 3-5 and may be formed of any of the same materials and by any of the same methods as described above with reference to FIGS. 3-5. The method described with reference to FIGS. 12-14 begins by utilizing the steps described above with reference to FIG. 3, which, for brevity, will not be described again. Accordingly, after performing the steps illustrated in FIG. 3, the polycrystalline silicon layer 80 and the multi-layer stack 58 are etched to form control gates 66 of first gate stack 52 and second gate stack 54 and to expose silicon substrate 56. Gate stacks 52 and 54 are used as an ion implantation mask to form a first, shallow impurity doped region or bitline region 152 in silicon substrate 56. First bitline region 152 preferably is formed by implanting an N-type impurity dopant, preferably arsenic ions or phosphorous ions, using an ion implant energy in the range of about 2 keV to about 30 keV. Preferably, the ion implant energy is in the range of about 3 keV to about 15 keV.

Referring to FIG. 13, after formation of first bitline region 152, a gate spacer material layer (not shown) is deposited conformally overlying gate stacks 52 and 54 and substrate 56. The gate spacer material then is anisotropically etched by, for example, RIE using a $CHF_3$, $CF_4$, or $SF_6$ chemistry, to form gate spacers 102 about the sidewalls 104 of gate stacks 52 and 54. Using the gate spacers 102 and gate stacks 52 and 54 as an etch mask, the silicon substrate 56 is etched by, for example, plasma etching in a $C_4F_8$ and $O_2$ chemistry, to form a trench 156 in the silicon substrate. Trench 156 has a depth, illustrated by double-headed arrow 158, in the range of about 100 to about 800 angstroms as measured from surface 70 of substrate 56. Trench 156 can be shallower or deeper than bitline region 152. As described above, after etching of control gate material 66 and charge trapping stack 58 and after formation of gate spacers 102, a mask (not shown) may be selectively deposited orthogonally to the direction that the bitline regions to prevent formation of trenches 156 at those locations where a contact is to be made.

Referring to FIG. 14, after formation of trench 156, gate stacks 52 and 54 and gate spacers 102 are used as an ion implantation mask to form a second, deeper impurity doped region or bitline region 160 in silicon substrate 56 below trench 106. The second bitline region 160 preferably is formed by implanting an N-type impurity dopant, preferably arsenic ions or phosphorous ions, using an ion implant energy in the range of about 5 keV to about 40 keV. The trench 156 and second bitline region 160 preferably have a combined depth, illustrated by double-headed arrow 162, of about 400 to 1200 angstroms. Because of the presence of trench 156, second bitline region 160 does not have to be formed at as high an implant energy to block the diffusion of secondary electrons generated during programming as would be required without the presence of trench 156. Following the formation of second bitline region 160, the ARC layer 82, oxide spacers 86, and the gate spacers 102 can be removed using conventional methods.

Figure 15:
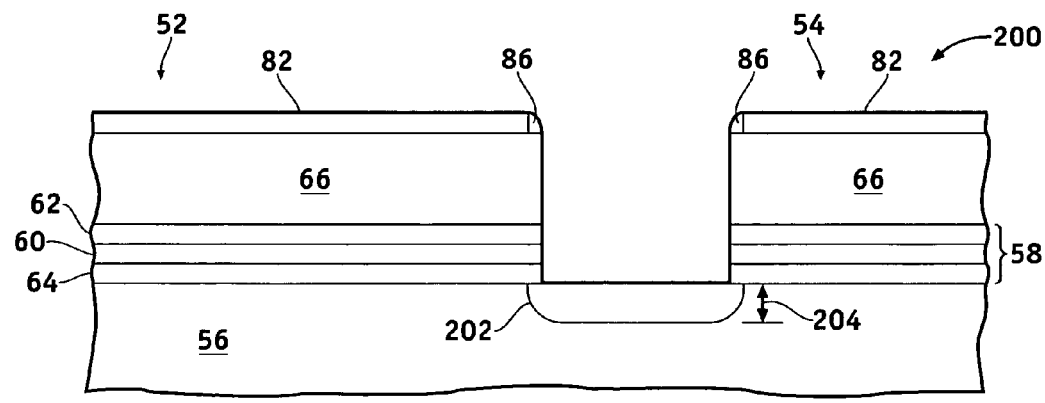
FIGS. 15-16 illustrate a method for fabricating a portion of dual bit memory device in accordance with another exemplary embodiment of the present invention.
Figure 16:
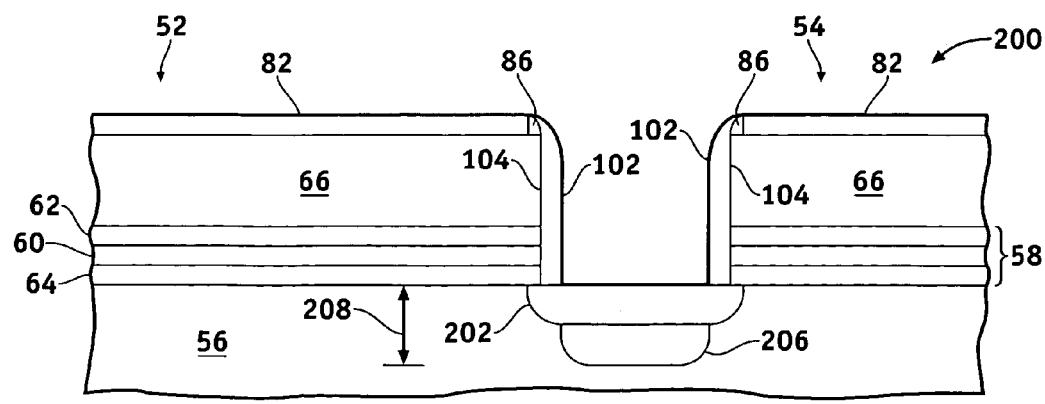

FIGS. 15-16 illustrate a method for fabricating a memory device 200 in accordance with another exemplary embodiment of the present invention. Flash memory device 200 is similar to flash memory device 50 of FIGS. 3-5 and, accordingly, elements of FIGS. 15-16 that have the same reference numbers as elements of FIGS. 3-5 are the same elements of FIGS. 3-5 and may be formed of any of the same materials and by any of the same methods as described above with reference to FIGS. 3-5. The method described with reference to FIGS. 15-16 begins by utilizing the steps described above with reference to FIG. 3, which, for brevity, will not be described again. Accordingly, after performing the steps illustrated in FIG. 3, the polycrystalline silicon layer 80 and the multi-layer stack 58 are etched to form control gates 66 of first gate stack 52 and second gate stack 54 and to expose silicon substrate 56. Gate stacks 52 and 54 are used as an ion implantation mask to form a first, shallow impurity doped region or bitline region 202 in silicon substrate 56. First bitline region 202 preferably is formed by implanting an N-type impurity dopant, preferably arsenic ions or phosphorous ions, using an ion plasma energy in the range of about 2 keV to about 30 keV. Preferably, the ion implant energy is in the range of about 3 keV to about 20 keV.

Referring to FIG. 16, after formation of first bitline region 202, a gate spacer material layer (not shown) is deposited conformally overlying gate stacks 52 and 54 and substrate 56. The gate spacer material then is anisotropically etched by, for example, RIE using a $CHF_3$, $CF_4$, or $SF_6$ chemistry, to form gate spacers 102 about the sidewalls 104 of gate stacks 52 and 54. Gate stacks 52 and 54 and gate spacers 102 are used as an ion implantation mask to form a second, deeper impurity doped region or bitline region 206 in silicon substrate 56. The second bitline region 206 preferably is formed by implanting an N-type impurity dopant, preferably arsenic ions or phosphorous ions, using an ion plasma energy in the range of about 10 keV to about 50 keV. The first bitline region 202 and the second bitline region 206 preferably have a combined depth, illustrated by double-headed arrow 208, as measured from surface 70 of substrate 56 of about 400 to 1200 angstroms. Following the formation of second bitline region 206, the ARC layer 82, oxide spacers 86, and the gate spacers 102 can be removed using conventional methods.

Accordingly, methods for fabricating dual bit memory devices have been provided. The methods provide for the scaling of the memory devices while overcoming transient program disturb challenges. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a memory device, the method comprising the steps of:
   forming a first ONO gate stack and a second ONO gate stack overlying a substrate;
   etching a trench into the substrate between the first gate stack and the second gate stack, wherein the trench is etched to a depth in the range of about 100 to about 800 angstroms as measured from a surface of the substrate; and
   forming a first impurity doped region within the substrate underlying the trench.

2. The method of claim 1, wherein the step of forming a first impurity doped region comprises the step of implanting an N-type impurity dopant using an ion implant energy in the range of about 2 keV to about 30 keV.

3. The method of claim 2, wherein the step of implanting an N-type impurity dopant using an ion implant energy in the range of about 2 keV to about 30 keV comprises the step of implanting the N-type impurity dopant using an ion implant energy in the range of about 3 keV to about 20 keV.

4. The method of claim 1, further comprising the step of forming gate spacers along sidewalls of the first gate stack and the second gate stack before the step of etching the trench.

5. The method of claim 1, further comprising the step of selectively depositing a mask on the substrate to prevent the formation of a trench at a location where a contact to the substrate is subsequently to be fabricated, wherein the step of selectively depositing is performed before the step of etching a trench.

6. The method of claim 1, further comprising the step of forming a second impurity doped region, wherein the step of forming a second impurity doped region is performed after the step of forming a first gate stack and a second gate stack and before the step of etching a trench.

7. The method of claim 6, wherein the step of forming a second impurity doped region comprises the step of implanting an N-type impurity dopant using an ion implant energy in the range of about 2 keV to about 30 keV.

8. The method of claim 7, wherein the step of forming a first impurity doped region comprises the step of implanting an N-type impurity dopant using an ion implant energy in the range of about 5 keV to about 40 keV.

9. The method of claim 6, further comprising the step of selectively depositing a mask on the substrate to prevent the formation of a trench at a location where a contact to the substrate is subsequently to be fabricated, wherein the step of selectively depositing is performed before the step of etching a trench.

10. The method of claim 1, wherein the step of forming a first gate stack and a second gate stack overlying a substrate comprises the steps of:
    fabricating a charge trapping stack on the substrate;
    forming a control gate material layer overlying the charge trapping stack;
    and etching the control gate material and the charge trapping stack to form the first gate stack and the second gate stack.

11. A method far fabricating a dual bit memory device, the method comprising the steps of:
    fabricating a charge trapping ONO stack overlying a substrate;

forming a control gate material overlying the charge trapping stack;

etching the control gate material and the charge trapping stack to the substrate;

etching the substrate to form a trench having a depth in the range of about 100 to about 800 angstroms as measured from a surface of the substrate; and implanting a first impurity dopant within the substrate underlying the trench to form a first bitline region.

12. The method of claim 11, wherein the step of implanting a first impurity dopant comprises the step of implanting an N-type impurity dopant using an ion implant energy in the range of about 2 keV to about 30 keV.

13. The method of claim 12, wherein the step of implanting an N-type impurity dopant using an ion implant energy in the range of about 2 keV to about 30 keV comprises the step of implanting the N-type impurity dopant using an ion implant energy in the range of about 3 key to about 20 keV.

14. The method of claim 11, further comprising the step of forming gate spacers along sidewalls of the control gate material and the charge trapping stack before the step of etching the trench.

15. The method of claim 11, further comprising the step of selectively depositing a mask on the substrate to prevent the formation of a trench at a location where a contact to the substrate is subsequently to be fabricated, wherein the step of selectively depositing is performed before the step of etching the substrate to form a trench.

16. The method of claim 11, further comprising the step of implanting a second impurity dopant within the substrate to form a second bitline region, wherein the step of implanting a second impurity dopant is performed after the step of etching the control gate material and the charge trapping stack to the substrate and before the step of etching the substrate to form a trench.

17. The method of claim 16, wherein the step of implanting a second impurity dopant comprises the step of implanting an N-type impurity dopant using an ion implant energy in the range of about 2 keV to about 30 keV.

18. The method of claim 17, wherein the step of implanting a first impurity dopant comprises the step of implanting an N-type impurity dopant using an ion implant energy in the range of about 5 key to about 40 keV.

19. The method of claim 16, further comprising the step of selectively depositing a mask on the substrate to prevent the formation of a trench at a location where a contact to the substrate is subsequently to be fabricated, wherein the step of selectively depositing is performed before the step of etching the substrate to form a trench.

20. A method for fabricating a memory device, the method comprising the steps of:

fabricating a first ONO gate stack and a second ONO gate stack overlying a substrate;

forming a first impurity doped region in the substrate between the first gate stack and the second gate stack;

fabricating gate spacers about sidewalls of the first gate stack and the second gate stack after the step of forming the first impurity doped region; and forming a second impurity doped region in the substrate between the first gate stack and the second gate stack after the step of fabricating the gate spacers, wherein the second impurity doped region is deeper than the first impurity doped region.

21. The method of claim 20, wherein the step of forming a first impurity doped region comprises the step of implanting an N-type impurity dopant using an ion implant energy in the range of about 2 keV to about 30 keV.

22. The method of claim 20, wherein the step of forming a second impurity doped region comprises the step of implanting an N-type impurity dopant using an ion implant energy in the range of about 10 keV to about 50 keV.

* * * * *